United States Patent
Kwon et al.

(10) Patent No.: US 10,916,736 B2
(45) Date of Patent: Feb. 9, 2021

(54) DISPLAY PANEL AND METHOD OF MANUFACTURING THE SAME

(71) Applicant: Samsung Display Co., Ltd., Yongin-Si (KR)

(72) Inventors: Hokyoon Kwon, Seoul (KR); Jeonghun Kim, Asan-si (KR); Minwoo Byun, Seongnam-si (KR); Byeongguk Jeon, Daegu (KR); Jin-yup Kim, Cheonan-si (KR); Dae-hyun Noh, Hwaseong-si (KR)

(73) Assignee: Samsung Display Co., Ltd.

( * ) Notice: Subject to any disclaimer, the term of this patent is extended or adjusted under 35 U.S.C. 154(b) by 81 days.

(21) Appl. No.: 16/192,996

(22) Filed: Nov. 16, 2018

(65) Prior Publication Data

US 2019/0157630 A1 May 23, 2019

(30) Foreign Application Priority Data

Nov. 17, 2017 (KR) .................. 10-2017-0154261

(51) Int. Cl.
*H01L 51/56* (2006.01)
*H01L 27/32* (2006.01)
*G09G 3/3233* (2016.01)
*H01L 51/52* (2006.01)
(Continued)

(52) U.S. Cl.
CPC .......... *H01L 51/56* (2013.01); *G09G 3/3225* (2013.01); *G09G 3/3233* (2013.01); *H01L 27/124* (2013.01); *H01L 27/127* (2013.01); *H01L 27/1214* (2013.01); *H01L 27/1225* (2013.01); *H01L 27/1248* (2013.01); *H01L 27/1251* (2013.01); *H01L 27/3246* (2013.01); *H01L 27/3276* (2013.01); *H01L 51/5203* (2013.01); *H01L 51/5237* (2013.01);
(Continued)

(58) Field of Classification Search
None
See application file for complete search history.

(56) References Cited

U.S. PATENT DOCUMENTS 9,379,137 B2  6/2016  Kim et al.
2005/0243234 A1* 11/2005 Jung .................. G02F 1/13458
349/43
(Continued)

FOREIGN PATENT DOCUMENTS

KR  10-2015-0053154 A   5/2015
KR  10-2016-0119909 A  10/2016
KR       10-1695295 B1   1/2017

*Primary Examiner* — Erik Kielin
(74) *Attorney, Agent, or Firm* — Innovation Counsel LLP

(57) ABSTRACT

A display panel includes a base substrate in which an active area and a peripheral area adjacent to the active area are defined, a pixel disposed in the active area, a first line disposed in the active area and connected to the pixel, a second line disposed in the peripheral area and spaced apart from the first line in a plan view, a linking pattern electrically connecting the first line to the second line and disposed on a layer different from a layer on which each of the first and second lines is disposed, and an inorganic layer disposed between the first line and the linking pattern and between the second line and the linking pattern. The linking pattern is connected to the first line and the second line through contact holes formed in the inorganic layer.

17 Claims, 14 Drawing Sheets

(51) Int. Cl.
*H01L 27/12* (2006.01)
*G09G 3/3225* (2016.01)

(52) U.S. Cl.
CPC .............. *G09G 2300/0426* (2013.01); *G09G 2300/0819* (2013.01); *G09G 2300/0842* (2013.01)

(56) References Cited

U.S. PATENT DOCUMENTS

| | | | |
|---|---|---|---|
| 2006/0267914 A1* | 11/2006 | Chang | G02F 1/1345 345/100 |
| 2008/0284969 A1* | 11/2008 | Lim | G02F 1/13458 349/152 |
| 2016/0079280 A1* | 3/2016 | Kim | H01L 27/124 257/773 |
| 2016/0293107 A1 | 10/2016 | Jeong | |
| 2017/0193914 A1* | 7/2017 | Heo | G09G 3/3611 |
| 2017/0249896 A1* | 8/2017 | Kim | H01L 27/124 |
| 2017/0262109 A1* | 9/2017 | Choi | G06F 3/0412 |

\* cited by examiner

DISPLAY PANEL AND METHOD OF MANUFACTURING THE SAME

CROSS-REFERENCE TO RELATED APPLICATION

This application claims priority to Korean Patent Application No. 10-2017-0154261, filed on Nov. 17, 2017, and all the benefits accruing therefrom under 35 U.S.C. § 119, the content of which in its entirety is herein incorporated by reference.

BACKGROUND

1. Field

Embodiments of the inventive concept relate to a display panel and a method of manufacturing the same and, more particularly, to a display panel with improved reliability and a method of manufacturing the same.

2. Description of the Related Art

A display panel may include an active area which displays an image using electrical signals. Recently, display panels having various shapes have been demanded. For example, large-sized and/or asymmetrically shaped display panels have been demanded.

Thus, lengths of conductive lines for transmitting electrical signals to the active area may be increased, and conductive lines disposed in different areas may have different lengths and/or different shapes. Shapes and sizes of active areas of display panels may be variously changed through various line designs.

SUMMARY

Embodiments of the inventive concept may provide a display panel capable of realizing uniform image quality on an active area of which a shape is various.

Embodiments of the inventive concept may also provide a method of manufacturing a display panel, which is capable of improving reliability.

In an aspect of the inventive concept, a display panel includes a base substrate in which an active area and a peripheral area adjacent to the active area are defined, a pixel disposed in the active area, a first line disposed in the active area and connected to the pixel, a second line disposed in the peripheral area and spaced apart from the first line in a plan view, a linking pattern electrically connecting the first line to the second line and disposed on a layer different from a layer on which each of the first and second lines is disposed, and an inorganic layer disposed between the first line and the linking pattern and between the second line and the linking pattern. The linking pattern may be connected to the first line and the second line with penetrating the inorganic layer.

In an embodiment, the pixel may include a thin film transistor and an organic light emitting element connected to the thin film transistor, and the inorganic layer may be disposed between the thin film transistor and the organic light emitting element.

In an embodiment, the display panel may further include a first conductive pattern disposed between the first line and the linking pattern and being in contact with the first line, and a second conductive pattern disposed between the second line and the linking pattern and being in contact with the second line. The linking pattern may be connected to the first conductive pattern and the second conductive pattern through contact holes which are defined in the inorganic layer to expose the first conductive pattern and the second conductive pattern, respectively.

In an embodiment, the thin film transistor may include a semiconductor pattern, a control electrode overlapping the semiconductor pattern in a plan view, and an input electrode and an output electrode respectively connected to portions of the semiconductor pattern and spaced apart from each other with the control electrode interposed therebetween. The first conductive pattern and the second conductive pattern may be disposed on the same layer as the input electrode and the output electrode.

In an embodiment, the display panel may further include a load matching pattern disposed in the peripheral area. The second line may overlap with the load matching pattern in a plan view.

In an embodiment, the first line may provide a gate voltage to the pixel.

In an embodiment, the load matching pattern may receive a power voltage.

In an embodiment, the display panel may further include a third line which is disposed in the active area to intersect the first line and is connected to the pixel. The third line may be electrically connected to the load matching pattern.

In an embodiment, the inorganic layer may cover the third line, and the third line and the load matching pattern may constitute a single body shape.

In an embodiment, the display panel may further include a load matching linking pattern disposed on the inorganic layer. The third line may be spaced apart from the load matching pattern in a plan view, and the load matching linking pattern may electrically connect the load matching pattern and the third line with penetrating the inorganic layer.

In an embodiment, the second line may form an electric field with the load matching pattern.

In an embodiment, the display panel may further include an organic layer disposed on the inorganic layer. The linking pattern may electrically connect the first line and the second line with penetrating each of the inorganic layer and the organic layer.

In an embodiment, the active area may include a plurality of protruding areas facing each other with a notch interposed therebetween. Each of the pixel, the first line and the second line may be provided in plurality, and the second lines may be electrically connected to the first lines which are connected to pixels disposed in the protruding areas.

In an embodiment, the linking pattern may extend in one direction, and the first line and the second line may be spaced apart from each other in the one direction.

In another aspect of the inventive concept, a method of manufacturing a display panel includes forming a first line extending in one direction on a base substrate, forming a first insulating layer covering the first line, forming a second line which is spaced apart from the first line in a plan view, forming a third line intersecting the first line, forming a second insulating layer which covers the third line and includes an inorganic material, forming a third insulating layer which covers the second insulating layer and includes an organic material, and forming a linking pattern which connects the first line and the second line with penetrating the third insulating layer In an embodiment, the forming of the second insulating layer may use a deposition process.

In an embodiment, the method may further include forming a thin film transistor on the base substrate. The second insulating layer may be formed after the forming of the thin film transistor.

In an embodiment, the method may further include forming a plurality of connection patterns overlapping with the first line and the second line, respectively. The thin film transistor may include a semiconductor pattern, a control electrode, and an input electrode and an output electrode which are connected to the semiconductor pattern and are covered by the second insulating layer. The connection patterns may be formed simultaneously with the input electrode and the output electrode.

In an embodiment, the method may further include forming a load matching pattern which is spaced apart from the first line in a plan view and overlaps with the second line in a plan view, and the load matching pattern may be formed simultaneously with the third line.

In an embodiment, the method may further include forming a load matching pattern which is spaced apart from the first line in a plan view and overlaps with the second line in a plan view, and the load matching pattern may be formed simultaneously with the linking pattern.

BRIEF DESCRIPTION OF THE DRAWINGS

The above and other aspects and features of the present inventive concept will become more apparent by describing in further detail exemplary embodiments thereof with reference to the accompanying drawings, in which.

DETAILED DESCRIPTION OF THE EMBODIMENTS

Hereinafter, embodiments of the inventive concept will be described in detail with reference to the accompanying drawings.

Figure 1:
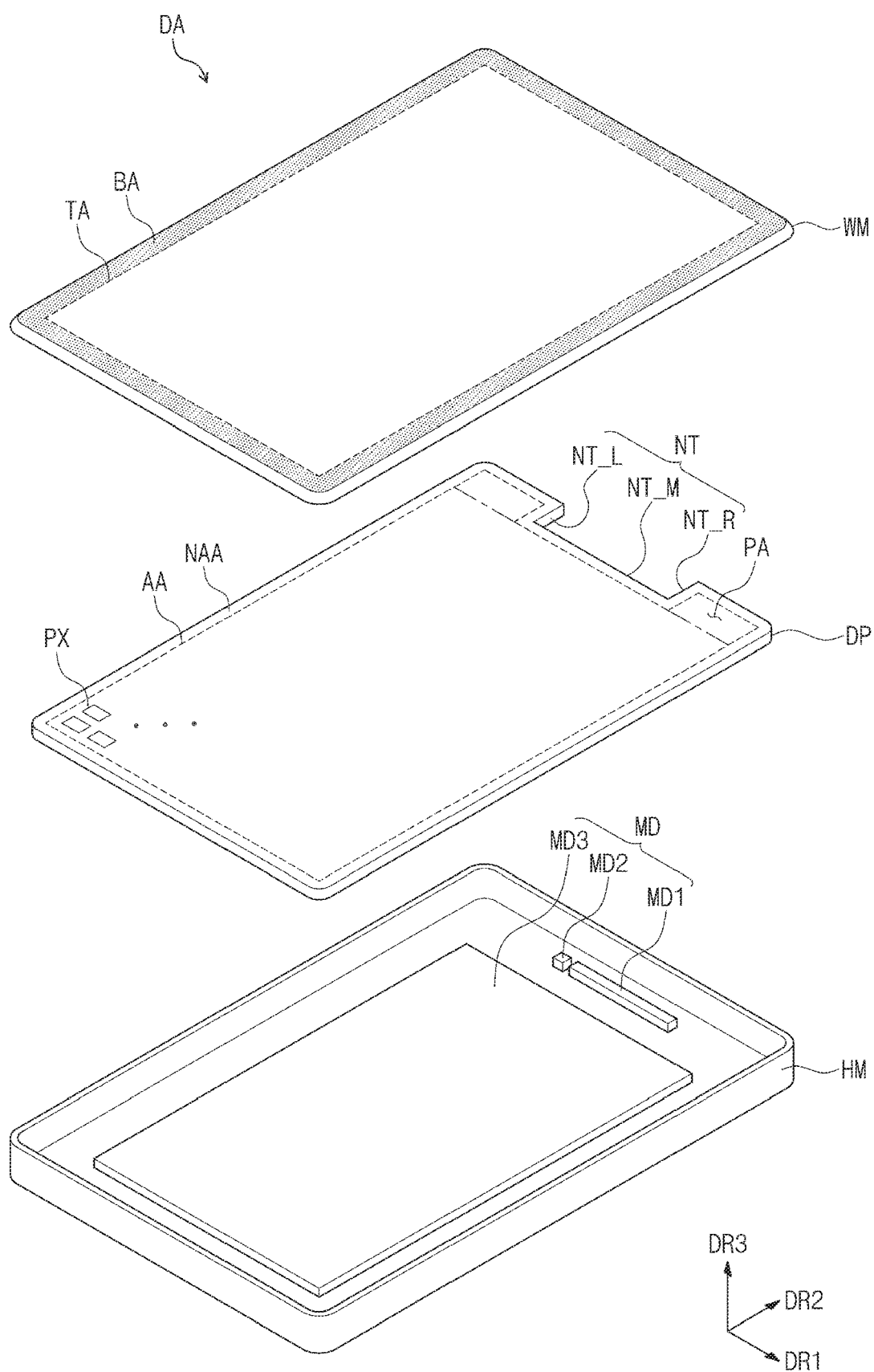
FIG. 1 is an exploded perspective view illustrating a display device according to an embodiment of the inventive concept.
Figure 2:
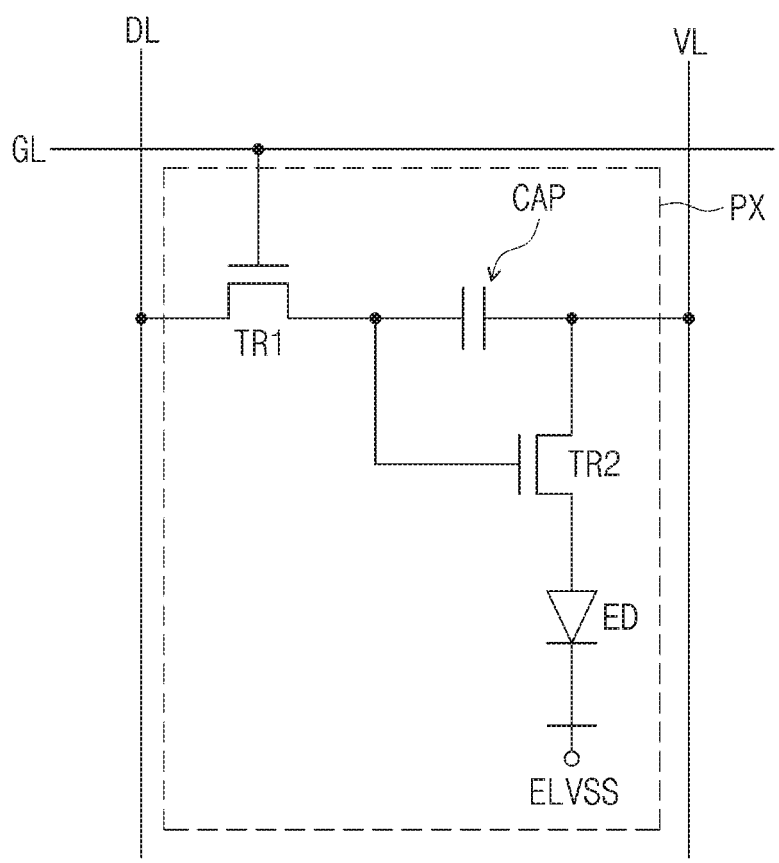
FIG. 2 is an equivalent circuit diagram schematically illustrating a pixel of FIG. 1.

FIG. 1 is an exploded perspective view illustrating a display device according to an embodiment of the inventive concept. FIG. 2 is an equivalent circuit diagram schematically illustrating a pixel of FIG. 1. Hereinafter, a display panel according to an embodiment of the inventive concept will be described with reference to FIGS. 1 and 2.

As illustrated in FIG. 1, a display device DA may include a display panel DP, an external module MD, a housing HM, and a window WM. The external module MD may include a plurality of modules MD1, MD2 and MD3.

The display panel DP may include an active area AA displaying an image using electrical signals and a peripheral area NAA adjacent to the active area AA. The display panel DP may include a plurality of pixels PX. The pixels PX may be arranged in the active area AA.

An equivalent circuit of one pixel PX is illustrated in FIG. 2 for the purpose of ease and convenience in description. As illustrated in FIG. 2, the pixel PX may be connected to a gate line GL, a data line DL, and a power line VL. The pixel PX may include a first thin film transistor TR1, a second thin film transistor TR2, a capacitor CAP, and an organic light emitting element ED.

The first thin film transistor TR1 may be turned on/off by a gate voltage provided from the gate line GL and may receive a data voltage provided from the data line DL. The first thin film transistor TR1 may function as a switching element of the pixel PX.

The second thin film transistor TR2 may be turned on/off by a voltage provided from the first thin film transistor TR1 and may transmit a voltage stored in the capacitor CAP to the organic light emitting element ED. The second thin film transistor TR2 may control a driving current flowing through the organic light emitting element ED in response to the voltage stored in the capacitor CAP. The second thin film transistor TR2 may function as a driving element of the pixel PX.

The capacitor CAP may be connected between a gate of the first thin film transistor TR1 and the power line VL. The capacitor CAP may store a voltage corresponding to a potential difference between a voltage provided from the first thin film transistor TR1 and a first power source voltage provided from the power line VL. When the second thin film transistor TR2 is turned on, the capacitor CAP may provide the stored voltage to the organic light emitting element ED through the second thin film transistor TR2.

The organic light emitting element ED may generate light by exciting a light emitting material by a voltage corresponding to a difference between a second power source voltage ELVSS and the voltage provided from the second thin film transistor TR2. Light emitted by one pixel PX may be light emitted from one organic light emitting element ED.

Referring again to FIG. 1, the display panel DP may include at least one notch NT. In other words, the display panel DP may include four sides in a plan view, and the notch NT may be a portion recessed from one of the sides toward a center of the display panel DP in a plan view.

The notch NT may include a first side surface NT_L, a second side surface NT_R, and a third side surface NT_M. Each of the first and second side surfaces NT_L and NT_R may extend in a second direction DR2 and may be perpendicular to a first direction DR1.

The first side surface NT_L and the second side surface NT_R may be surfaces facing each other in the first direction DR1. The notch NT may form the first side surface NTL and/or the second side surface NT_R in the second direction DR2 and may be defined to be recessed toward the inside of the display panel DP.

The third side surface NT_M may extend in the first direction DR1 and may be perpendicular to the second direction DR2. The third side surface NT_M may be a surface connecting the first side surface NT_L and the second side surface NT_R.

The active area AA may have a recessed portion corresponding to the notch NT. The active area AA may have a shape in which a portion of one side is recessed toward a center of the display panel DP in a plan view.

In the present embodiment, the active area AA may include a plurality of protruding areas PA facing each other in the first direction DR1 with the notch NT interposed therebetween. In FIG. 1, the protruding areas PA are divided by an imaginary line (an alternated long and short dash line). The pixels PX may be disposed in an entire area of the active area AA and thus may also be disposed in the protruding areas PA. This will be described later in more detail.

The external module MD may include a sound module MD1, an optical module MD2, and a power module MD3. The sound module MD1 may include a sound output module which converts an electrical signal into a sound signal and outputs the converted sound signal, and/or a sound input module which receives an external sound signal and converts the received sound signal into an electrical signal.

The optical module MD2 may include at least one of a light receiving module which receives an external optical signal (e.g., infrared light) and converts the received optical signal into an electrical signal, a light emitting module which receives an electrical signal and outputs an optical signal (e.g., infrared light or visible light) corresponding to the electrical signal, or a camera module which acquires an image of an external object.

The power module MD3 may supply power necessary for overall operations of the display device DA. The sound module MD1, the optical module MD2 and the display panel DP may be supplied with the power from the power module MD3. The power module MD3 may include a general battery module.

In the present embodiment, at least one of the modules of the external module MD may be assembled to overlap with a recessed area defined by the notch NT. For example, the sound module MD1 and the optical module MD2 may be disposed to overlap with the recessed area defined by the notch NT. Since the display panel DP according to the embodiment of the inventive concept includes the notch NT, the housing HM may stably receive the external module MD and the display panel DP without an increase in size of the housing HM. Thus, the display device DA may have a narrow bezel area.

On the other hand, even though not shown in the drawings, the external module MD may further include a bracket which fixes components (e.g., the display panel DP, the sound module MD1, the optical module MD2, the power module MD3, etc.) of the display device DA, a case which protects the components of the display device DA, and an electronic module electrically connected to the components of the display device DA. In another embodiment, at least one of the sound module MD1, the optical module MD2, or the power module MD3 may be omitted.

The housing HM may provide a predetermined inner space. The display panel DP and the external module MD may be received in the inner space. Since a portion of the external module MD is provided in the notch NT of the display panel DP as described above, an increase in area of the housing HM may be minimized or prevented.

The window WM may be disposed on the display panel DP. The window WM may protect the display panel DP. The window WM may be coupled to the housing HM to form an inner space. The window WM and the housing HM may form the exterior of the display device DA.

The window WM may be divided into a transmission area TA and a bezel area BA when viewed in a plan view. The transmission area TA may transmit most of light incident thereto. The transmission area TA may have optical transparency. The transmission area TA may have a light transmittance of about 90% or more.

The bezel area BA may block most of light incident thereto. The bezel area BA may prevent components disposed under the window WM from being perceived by a user. In addition, the bezel area BA may reduce reflection of light incident from the outside of the display device DA.

The bezel area BA may be adjacent to the transmission area TA. A shape of the transmission area TA in a plan view may be defined by the bezel area BA. In the present embodiment, the transmission area TA may cover at least the active area AA of the display panel DP. The bezel area BA may cover the peripheral area NAA of the display panel DP.

Meanwhile, in the present embodiment, the transmission area TA may be formed to overlap with the recessed area defined by the notch NT. Thus, the modules MD1 and MD2 disposed in the recessed area may be perceived by a user. In addition, the protruding areas PA may also be perceived by a user through the transmission area TA. Thus, images displayed in the protruding areas PA may be easily provided to a user through the transmission area TA.

However, embodiments of the inventive concept are not limited thereto. In another embodiment, the transmission area TA may have a shape corresponding to the active area AA, and the recessed area may be covered by the bezel area BA. In this case, the modules MD1 and MD2 disposed in the recessed area may not be perceived by a user.

The window WM may have a size capable of covering the display panel DP and the recessed area defined by the notch NT. Thus, the window WM may stably protect the display panel DP and the some modules disposed in the recessed area.

Since the display panel DP according to the embodiment of the inventive concept further includes the notch NT, a portion of the external module MD may be disposed on the same layer (or at the same level) as the display panel DP. Thus, the display device DA may include various modules without increasing the inner space and/or the bezel area BA and thus may provide various other functions as well as the display function of an image to a user.

Figure 3:
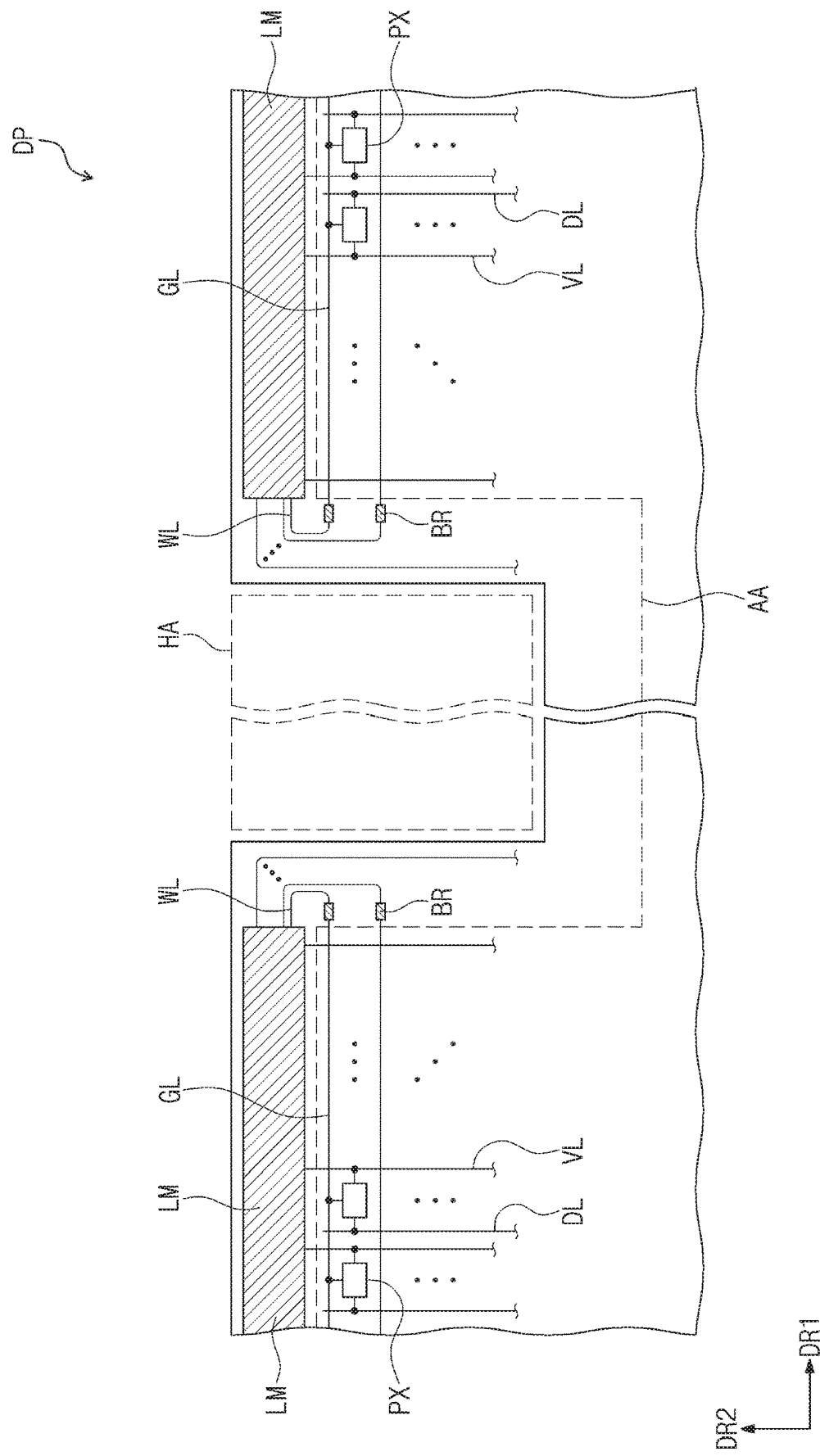
FIG. 3 is a schematic plan view illustrating a portion of a display panel according to an embodiment of the inventive concept.
Figure 4:
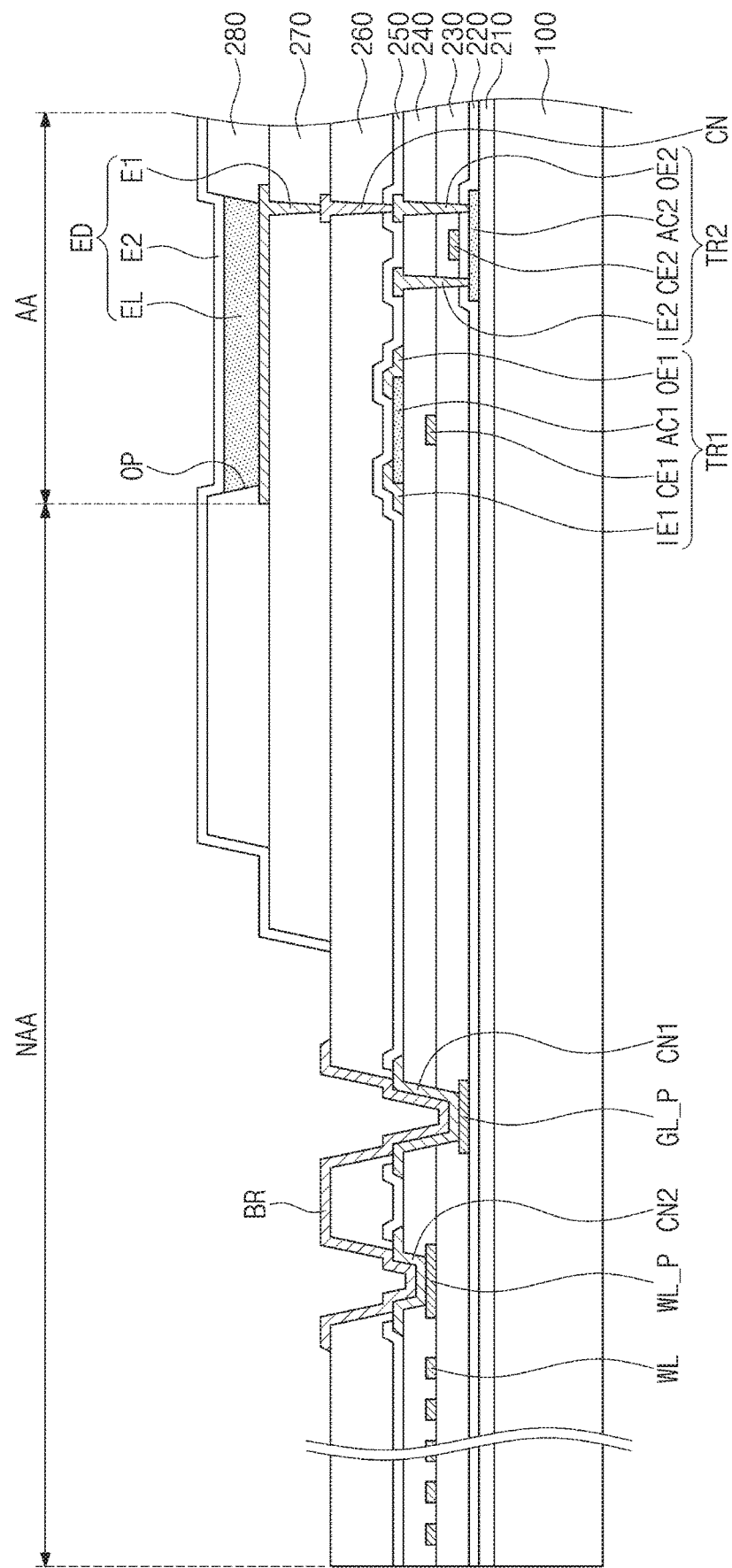
FIG. 4 is a cross-sectional view corresponding to a portion of FIG. 3.

FIG. 3 is a schematic plan view illustrating a portion of a display panel according to an embodiment of the inventive concept. FIG. 4 is a cross-sectional view corresponding to a portion of FIG. 3. FIG. 3 illustrates a plan view of an area in which the notch NT and the recessed area HA are defined. FIG. 4 illustrates a cross-sectional view of the peripheral area NAA and the active area AA including one pixel PX of FIG. 3. Hereinafter, the display panel according to an embodiment of the inventive concept will be described with reference to FIGS. 3 and 4.

As illustrated in FIGS. 3 and 4, the active area AA may have a shape which surrounds the recessed area HA and of which one side is recessed along the notch NT. The pixels PX may be arranged in a matrix form in the active area AA.

The display panel DP may include a base substrate 100, the pixel PX, and a plurality of insulating layers. The base substrate 100 may have an insulating property. For example, the base substrate 100 may be a silicon substrate, a plastic substrate, a glass substrate, an insulating film, or a stack structure including a plurality of insulating layers.

FIG. 4 illustrates the first thin film transistor TR1, the second thin film transistor TR2 and the organic light emitting element ED of the components of the pixel PX. The first thin film transistor TR1 may include a first control electrode CE1, a first semiconductor pattern AC1, a first input electrode IE1, and a first output electrode OE1.

In the present embodiment, the first semiconductor pattern AC1 may be disposed on the first control electrode CE1. In addition, the first input electrode IE1 and the first output electrode OE1 may be disposed directly on a top surface of the first semiconductor pattern AC1. Thus, the first input electrode IE1 and the first output electrode OE1 may be connected to the first semiconductor pattern AC1 without an additional contact hole. However, this is illustrated as an example. In the first thin film transistor TR1 according to another embodiment, the first control electrode CE1 may be disposed on the first semiconductor pattern AC1, and the first input electrode IE1 and the first output electrode OE1 may be connected to the first semiconductor pattern AC1 through contact holes. Alternatively, the first input electrode TE1 and the first output electrode OE1 may be disposed under the first semiconductor pattern AC1. The first thin film transistor TR1 according to the inventive concept may have any one of various structures and may not be limited to a specific embodiment.

The second thin film transistor TR2 may include a second control electrode CE2, a second semiconductor pattern AC2, a second input electrode IE2, and a second output electrode OE2. In the present embodiment, the second semiconductor pattern AC2 may be disposed under the second control electrode CE2. The second input electrode IE2 and the second output electrode OE2 may be connected to portions of the second semiconductor pattern AC2 through contact holes formed in at least one of the insulating layers, respectively.

However, this is illustrated as an example. In the second thin film transistor TR2 according to another embodiment, the second control electrode CE2 may be disposed under the second semiconductor pattern AC2, and the second input electrode IE2 and the second output electrode OE2 may be disposed directly on the second semiconductor pattern AC2. The second thin film transistor TR2 according to the inventive concept may have any one of various structures and may not be limited to a specific embodiment.

In the present embodiment, the first semiconductor pattern AC1 may include an oxide semiconductor. Thus, occurrence of a leakage current in the first thin film transistor TR1 may be inhibited to improve on/off characteristics of the first thin film transistor TR1.

In the present embodiment, the second semiconductor pattern AC2 may include a poly-crystalline semiconductor. The poly-crystalline semiconductor may improve a mobility characteristic of the second semiconductor pattern AC2. Thus, the second thin film transistor TR2 may be easily driven by a low driving voltage.

In the display panel DP according to the embodiment of the inventive concept, the one pixel PX may include the first and second thin film transistors TR1 and TR2 formed of the different materials from each other. Thus, each of the first and second thin film transistors TR1 and TR2 may be used to facilitate appropriate functions during design of the pixel PX. As a result, it is possible to realize the display panel DP which has the improved on/off characteristics and low power consumption.

The components of each of the first and second thin film transistors TR1 and TR2 may be disposed on layers separated by the insulating layers. For example, as illustrated in FIG. 4, a first insulating layer 210 may be disposed between the base substrate 100 and the second control electrode CE2. The second semiconductor pattern AC2 may be disposed on the first insulating layer 210.

The first insulating layer 210 may be a buffer layer which provides a modified surface to the second semiconductor pattern AC2. An adhesive strength between the second semiconductor pattern AC2 and the first insulating layer 210 may be greater than an adhesive strength between the second semiconductor pattern AC2 and the base substrate 100, and thus the second semiconductor pattern AC2 may be stably formed on the first insulating layer 210.

Alternatively, the first insulating layer 210 may be a barrier layer which protects a bottom surface of the second semiconductor pattern AC2. Since the first insulating layer 210 prevents the second semiconductor pattern AC2 from being in direct contact with the base substrate 100, a contaminant or moisture permeating from or through the base substrate 100 to the second semiconductor pattern AC2 may be blocked by the first insulating layer 210.

In an embodiment, the first insulating layer 210 may be a shielding layer which prevents external light from being provided to the second semiconductor pattern AC2 through the base substrate 100. In this case, the first insulating layer 210 may further include a light shielding material.

A second insulating layer 220 may be disposed between the second control electrode CE2 and the second semiconductor pattern AC2. The second insulating layer 220 may be a gate insulating layer of the second thin film transistor TR2. The second control electrode CE2 may be disposed on the second insulating layer 220.

The second insulating layer 220 may include an organic layer and/or an inorganic layer. The second insulating layer 220 may be a single layer or a multi-layer including a plurality of stacked layers. However, the second insulating layer 220 is not limited to a specific embodiment.

A third insulating layer 230 may be disposed between the second control electrode CE2 and the first control electrode CE1. The first control electrode CE1 may be disposed on the third insulating layer 230. The third insulating layer 230 may provide a flat surface to the first control electrode CE1. The third insulating layer 230 may include an inorganic layer and/or an organic layer.

A fourth insulating layer 240 may be disposed between the first control electrode CE1 and the first semiconductor pattern AC1. The fourth insulating layer 240 may be a gate insulating layer of the first thin film transistor TR1. The first semiconductor pattern AC1 may be disposed on the fourth insulating layer 240.

A fifth insulating layer 250 may be disposed on the fourth insulating layer 240 to cover the first input electrode IE1, the first output electrode OE1, the first semiconductor pattern AC1, the second input electrode IE2, and the second output electrode OE2.

In the present embodiment, the fifth insulating layer 250 may be a passivation layer which covers the first thin film transistor TR1 and the second thin film transistor TR2. The fifth insulating layer 250 may include an inorganic layer. The fifth insulating layer 250 may be formed by depositing an inorganic material. This will be described later in more detail.

As described above, the first input electrode IE1 and the first output electrode OE1 may be disposed on the same layer (i.e., the fourth insulating layer 240) as the first semiconductor pattern AC1 and thus may be connected directly to the first semiconductor pattern AC1. The second input electrode IE2 and the second output electrode OE2 may be disposed on the fourth insulating layer 240 different from the layer on which the second semiconductor pattern AC2 is disposed. Thus, the second input electrode IE2 and the second output electrode OE2 may be connected to the second semiconductor pattern AC2 through contact holes formed in the second, third and fourth insulating layers 220, 230 and 240.

A sixth insulating layer 260 may be disposed on the fifth insulating layer 250. The sixth insulating layer 260 may be a planarization layer providing a flat top surface. The sixth insulating layer 260 may include an organic layer or may have a stack structure including an organic layer and an inorganic layer.

A seventh insulating layer 270 may be disposed on the sixth insulating layer 260. The seventh insulating layer 270 may include an organic layer or may have a stack structure including an organic layer and an inorganic layer. The seventh insulating layer 270 may be a planarization layer providing a flat top surface. The seventh insulating layer 270 may be a layer on which the organic light emitting element ED is disposed. A first electrode E1 of the organic light emitting element ED may be disposed on the seventh insulating layer 270.

The first electrode E1 may be connected to a connection pattern CN which is connected to the second thin film transistor TR2 through a contact hole formed in the fifth and sixth insulating layer. The first electrode E1 may be connected to the connection pattern CN through a contact hole formed in the seventh insulating layer.

The connection pattern CN connects the first electrode E1 and the second output electrode OE2. The connection pattern CN may be disposed on the sixth insulating layer 260 Since the display panel DP according to an embodiment further includes the connection pattern CN, the organic light emitting element ED may be easily connected to the second thin film transistor TR2 through the contact hole formed in the seventh insulating layer 270.

An eighth insulating layer 280 may be disposed on the seventh insulating layer 270. An opening OP may be defined in the eighth insulating layer 280. The opening OP may be formed to overlap with the first electrode E1 and may expose at least a portion of the first electrode E1.

An emission pattern EL of the organic light emitting element ED may be disposed in the opening OP. The emission pattern EL may be disposed on the first electrode E1 in the opening OP. The emission pattern EL may include a light emitting material. When an electrical signal is applied to the light emitting material, the light emitting material may be excited to generate light of a predetermined color. The emission pattern EL may include an organic material or an inorganic material.

A second electrode E2 of the organic light emitting element ED may be disposed on the eighth insulating layer 280. The second electrode E2 may have a single body shape which covers the eighth insulating layer 280 and the opening OP. However, this is illustrated as an example. In another embodiment, the second electrode E2 may have a shape corresponding to the first electrode E1. The shape of the second electrode E2 is not limited to one embodiment.

Meanwhile, even though not shown in the drawings, the organic light emitting element ED may further include at least one organic layer disposed between the emission pattern EL and the first electrode E1 or between the emission pattern EL and the second electrode E2. The organic layer may control the movement of charges between the first electrode E1 and the emission pattern EL or between the second electrode E2 and the emission pattern EL to control luminous efficiency of the organic light emitting element ED.

Referring again to FIG. 3, the display panel DP according to the inventive concept may further include a load matching pattern LM, a matching line WL, and a linking pattern BR. The load matching pattern LM, the matching line WL and the linking pattern BR may be disposed in the peripheral area NAA.

The load matching pattern LM may include a conductive material. The load matching pattern LM may be disposed in the peripheral area NAA so as to be spaced apart from the pixels PX in a plan view. The load matching pattern LM may be a single conductive pattern. Alternatively, even though not shown in the drawings, the load matching pattern LM may include a plurality of conductive patterns disposed on a single layer.

The load matching pattern LM may be connected to the power line VL disposed in the active area AA. The load matching pattern LM and the power line VL may be provided with the same voltage. In other words, the load matching pattern LM may receive a power voltage. This will be described later in more detail.

The matching line WL may be provided to correspond to each of rows of the pixels PX disposed in the protruding area PA. The matching line WL may be provided in plurality, and the matching lines WL may respectively correspond to the gate lines GL which are connected to the pixels PX disposed in the protruding area PA.

The matching line WL may be disposed on a layer different from a layer on which the load matching pattern LM is disposed. The matching line WL may extend to overlap with the load matching pattern LM when viewed in a plan view. Even though not shown in the drawings, the matching line WL may extend in the first direction DR1 to intersect the load matching pattern LM in an area in which the load matching pattern LM is disposed.

The load matching pattern LM may form a predetermined electric field with the matching line WL in an area in which the load matching pattern LM overlaps with the matching line WL. This will be described later in more detail.

The linking pattern BR may connect one matching line WL to one gate line GL. The linking pattern BR may connect each of the gate lines GL disposed in the protruding area PA to a corresponding one of the matching lines WL.

The linking pattern BR may be disposed on a layer different from layers on which the gate line GL and the matching line WL are disposed. Referring to FIG. 4, the linking pattern BR may be disposed on the sixth insulating layer 260 to electrically connect a pad GL_P of the gate line disposed on the second insulating layer 220 to a pad WL_P of the matching line disposed on the third insulating layer 230.

The pad GL_P of the gate line may be an extended portion of the gate line GL, which is defined at one end of the gate line GL. Thus, the pad GL_P of the gate line may be disposed on the second insulating layer 220 on which the gate line GL is disposed. The pad GL_P of the gate line may have a relatively wide area to easily connect the linking pattern BR to the pad GL_P of the gate line.

The pad WL_P of the matching line may be an extended portion of the matching line WL, which is defined at one end of the matching line WL. Thus, the pad WL_P of the matching line may be disposed on the same layer as the matching line WL. In the present embodiment, the matching line WL and the pad WL_P of the matching line may be disposed on the same layer as the first control electrode CE1.

The linking pattern BR may be disposed on the layer different from the layer on which each of the gate line GL and the matching line WL is disposed. The linking pattern BR may connect the gate line GL and the matching line WL through contact holes. In other words, the linking pattern BR may electrically connect the peripheral area NAA and the active area AA.

In the display panel DP according to the present embodiment, the linking pattern BR may be disposed on at least the fifth insulating layer 250. Thus, the linking pattern BR may be formed after a process of forming the fifth insulating layer 250. As a result, it is possible to prevent the process of forming the fifth insulating layer 250 from affecting the linking pattern BR. This will be described later in more detail.

On the other hand, the display panel DP may further include a first connection pattern CN1 and a second connection pattern CN2. The first connection pattern CN1 and the second connection pattern CN2 may be disposed on the same layer as the first input electrode IE1, the first output electrode OE1, the second input electrode IE2, and the second output electrode OE2. In other words, each of the first and second connection patterns CN1 and CN2 may be disposed between the fourth insulating layer 240 and the fifth insulating layer 250 and may be exposed by the fifth insulating layer 250.

The first connection pattern CN1 may be connected to the pad GL_P of the gate line with penetrating the third insulating layer 230. The first connection pattern CN1 may be connected to the pad GL_P of the gate line through a contact hole formed in the fourth insulating layer 240 and the third insulating layer 230. The second connection pattern CN2 may be connected to the pad WL_P of the matching line with penetrating the fourth insulating layer 240. The second connection pattern CN2 may be connected to the pad WL_P of the matching line through a contact hole formed in the fourth insulating layer 240. The linking pattern BR may be connected to the gate line GL and the matching line WL through the first connection pattern CN1 and the second connection pattern CN2, and thus it is possible to improve stability of the electrical connection between the gate line GL and the matching line WL.

Figure 5A:
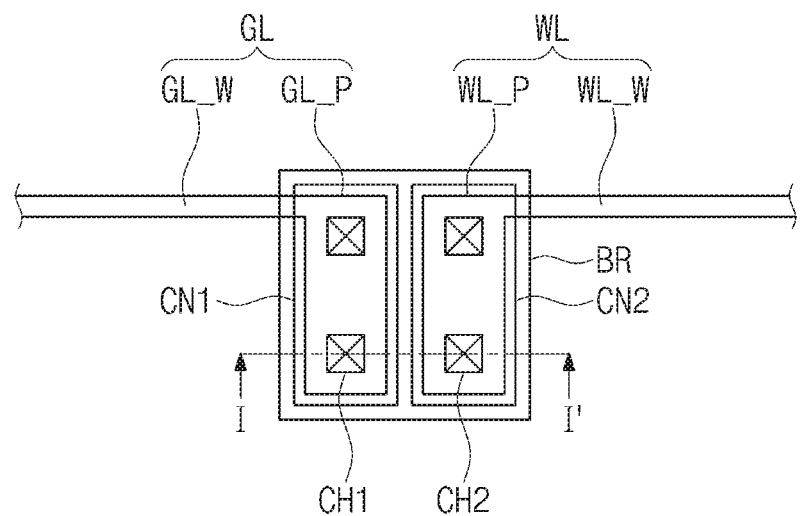
FIG. 5A is a plan view illustrating a portion of a display panel according to an embodiment of the inventive concept.
Figure 5B:
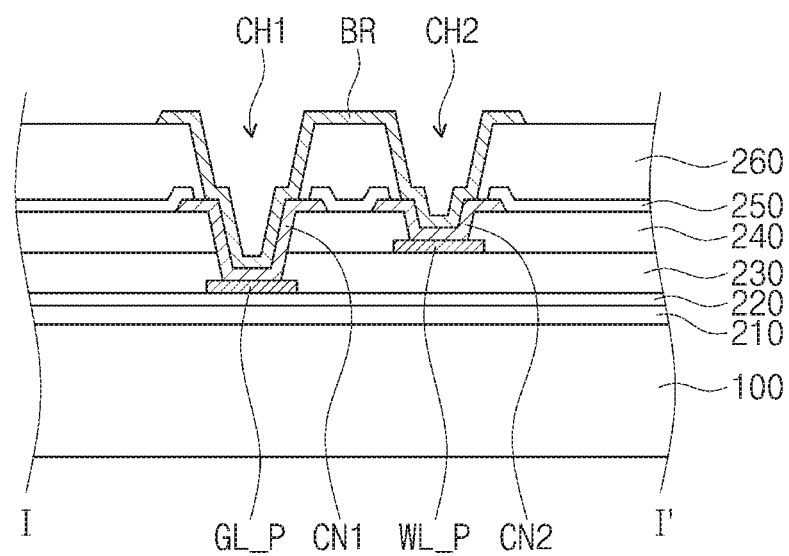
FIG. 5B is a cross-sectional view taken along a line I-I' of FIG. 5A.

FIG. 5A is a plan view illustrating a portion of a display panel according to an embodiment of the inventive concept. FIG. 5B is a cross-sectional view taken along a line I-I' of FIG. 5A. FIGS. 5A and 5B are enlarged views illustrating an area in which the linking pattern BR of FIG. 3 is disposed. FIG. 5B may substantially correspond to the cross-sectional view of the linking pattern BR illustrated in FIG. 4.

Hereinafter, the display panel DP according to an embodiment of the inventive concept will be described with reference to FIGS. 5A and 5B. In the present embodiment, the same components as described with reference to FIGS. 1 to 4 will be indicated by the same reference numerals or designators, and the descriptions thereto will be omitted for the purpose of ease and convenience in description and illumination.

As illustrated in FIGS. 5A and 5B, the linking pattern BR may connect a plurality of lines spaced apart from each other. The linking pattern BR may electrically connect a first line GL disposed in the active area AA (see FIG. 3) to a second line WL disposed in the peripheral area NAA (see FIG. 3).

In the present embodiment, the first line GL may correspond to the gate line GL, and the second line WL may correspond to the matching line WL. In other words, the linking pattern BR electrically connects the gate line GL and the matching line WL. The linking pattern BR may be disposed to overlap with a portion of the gate line GL and a portion of the matching line WL when viewed in a plan view.

The gate line GL may include a line portion GL_W and a pad GL_P. The line portion GL_W of the gate line and the pad GL_P of the gate line may be connected to each other to constitute the gate line GL having a single body shape. A width of the pad GL_P of the gate line may be greater than a width of the line portion GL_W of the gate line.

The first connection pattern CN1 may be disposed to overlap with the pad GL_P of the gate line and the linking pattern BR when viewed in a plan view. The first connection pattern CN1 may be disposed between the pad GL_P of the gate line and the linking pattern BR when viewed in a cross-sectional view.

The linking pattern BR may be connected to the gate line GL through a first contact hole CH1. The first contact hole CH1 may be formed through the third insulating layer 230, the fourth insulating layer 240, the fifth insulating layer 250, and the sixth insulating layer 260. The pad GL_P of the gate line, the first connection pattern CN1 and the linking pattern BR may be connected to each other in the first contact hole CH1.

The matching line WL may include a line portion WL_W and a pad WL_P. The line portion WL_W of the matching line and the pad WL_P of the matching line may be connected to each other to constitute the matching line WL having a single body shape. A width of the pad WL_P of the matching line may be greater than a width of the line portion WL_W of the matching line.

The second connection pattern CN2 may be disposed to overlap with the pad WL_P of the matching line and the linking pattern BR when viewed in a plan view. The second connection pattern CN2 may be disposed between the pad WL_P of the matching line and the linking pattern BR when viewed in a cross-sectional view.

The linking pattern BR may be connected to the matching line WL through a second contact hole CH2. The second contact hole CH2 may be formed through the fourth insulating layer 240, the fifth insulating layer 250, and the sixth insulating layer 260. The pad WL_P of the matching line, the second connection pattern CN2 and the linking pattern BR may be connected to each other in the second contact hole CH2.

In the display panel DP according to the present embodiment, the gate line GL corresponding to the line disposed in the active area AA may be connected to the matching line WL corresponding to the line disposed in the peripheral area NAA through the linking pattern BR disposed on the fifth insulating layer 250. The fifth insulating layer 250 according to the inventive concept is formed by a deposition process.

Since the linking pattern BR is formed after the formation of the fifth insulating layer 250, the active area AA may be electrically insulated from the peripheral area NAA in the process of forming the fifth insulating layer 250. Thus, even though static electricity is generated at the peripheral area NAA in the deposition process of the fifth insulating layer 250, it is possible to prevent the static electricity from being transferred to the active area AA because the active area AA is not electrically connected to the peripheral area NAA.

According to the inventive concept, since the gate line GL is connected to the matching line WL through the linking pattern BR formed on the fifth insulating layer 250, it is possible to block the influence of the formation process of the fifth insulating layer 250 on the active area AA through the linking pattern BR. As a result, reliability of manufacturing processes of the display panel DP may be improved.

Figure 6A:
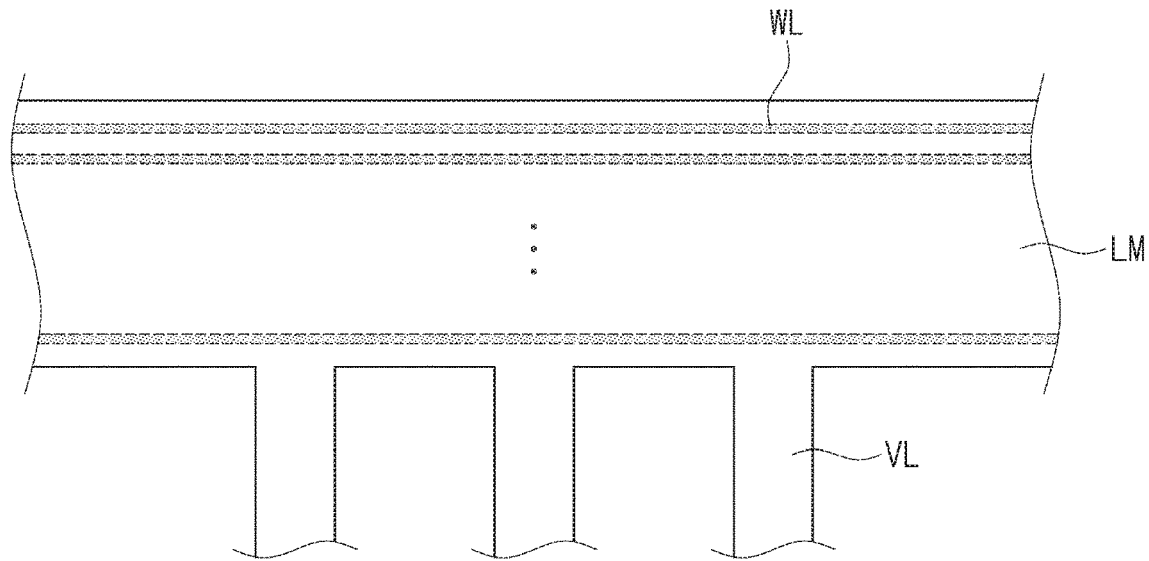
FIGS. 6A and 6B are plan views illustrating some components of display panels according to an embodiment of the inventive concept.
Figure 6B:
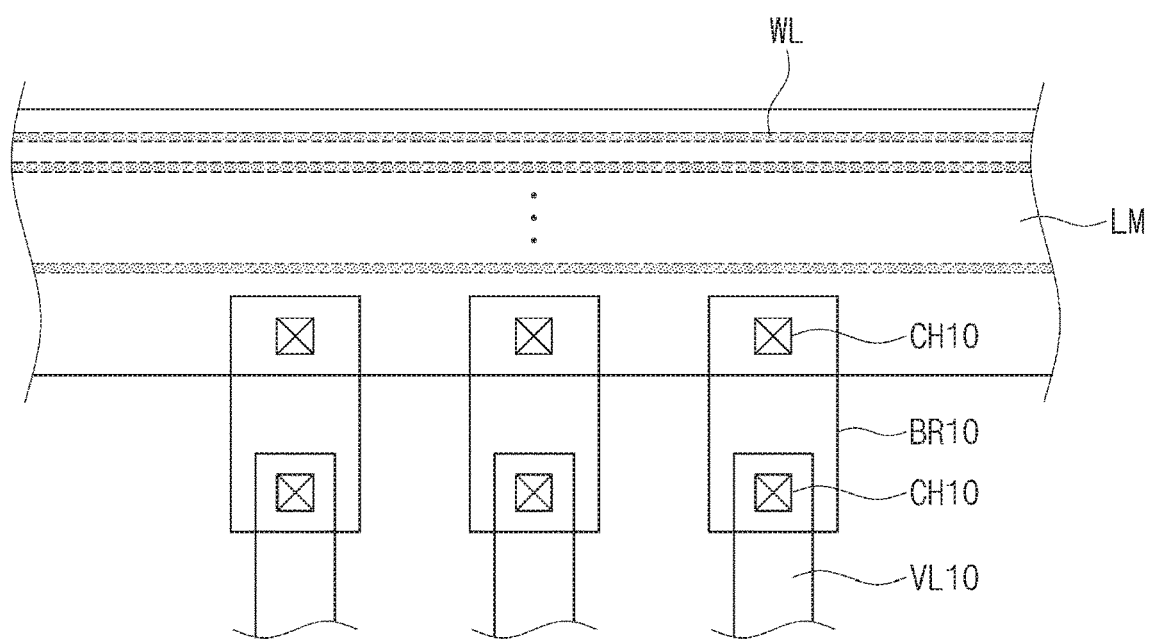

FIGS. 6A and 6B are plan views illustrating some components of display panels according to an embodiment of the inventive concept. FIG. 6A illustrates the load matching pattern LM of FIG. 3, and FIG. 6B illustrates a load matching pattern LM according to another embodiment of the inventive concept. Hereinafter, display panels according to an embodiment of the inventive concept will be described with reference to FIGS. 6A and 6B.

As illustrated in FIG. 6A, the load matching pattern LM and the power line VL may be connected to each other to constitute a single body shape. The load matching pattern LM and the power line VL may be disposed on the same layer.

The load matching pattern LM may overlap with the matching lines WL when viewed in a plan view. In the present embodiment, the matching lines WL are illustrated by dotted lines for the purpose of ease and convenience in description and illustration.

In the present embodiment, the load matching pattern LM and the power line VL may be provided with the same voltage. The load matching pattern LM may form an electric field with the matching lines WL. The display panel according to an embodiment may delay the response of gate signals provided to the gate lines GL (see FIG. 3) connected to the matching lines WL by the electric field formed between the load matching pattern LM and the matching lines WL. As a result, substantially uniform response speeds may be realized in the entire area of the active area AA including the protruding area PA, and thus the display panel displaying an image of uniform brightness may be realized. However, this is described as an example. In another embodiment, the load matching pattern LM may receive a voltage (e.g., a data signal) which delays the response of the gate signal in the active area AA. The inventive concept is not limited to one embodiment.

On the other hand, even though not shown in the drawings, the load matching pattern LM may include a plurality of patterns provided with the same voltage.

The plurality of patterns may have line shapes which have the same shapes as the matching lines WL. The plurality of patterns may overlap with the matching lines WL, respectively, and may be arranged in parallel to the matching lines WL.

Alternatively, the plurality of patterns may have line shapes which extend in a direction perpendicular to the matching lines WL. The plurality of patterns may overlap with the matching lines WL and may be arranged to intersect the matching lines WL.

However, embodiments of the inventive concept are not limited thereto. In other embodiments, the load matching pattern LM may have at least one of various other shapes overlapping with the matching lines WL to form the electric field.

As illustrated in FIG. 6B, a display panel may further include an additional linking pattern BR10 connecting a load matching pattern LM and a power line VL10. In this case, the power line VL10 may be spaced apart from the load matching pattern LM when viewed in a plan view. Thus, layers on which the power line VL10 and the load matching pattern LM are disposed may be determined independently of each other. The power line VL10 and the load matching pattern LM may be disposed on the same layer or may be disposed on different layers from each other.

The additional linking pattern BR10 may be connected to the power line VL10 and the load matching pattern LM through predetermined contact holes CH10, respectively. The additional linking pattern BR10 may electrically connect the power line VL10 and the load matching pattern LM to each other.

In the present embodiment, the additional linking pattern BR10 may be disposed on the load matching pattern LM and the power line VL10. The additional linking pattern BR10 may be disposed on the fifth insulating layer 250 illustrated in FIG. 4. In other words, the additional linking pattern BR10 may be disposed on the same layer as the linking pattern BR illustrated in FIG. 4.

According to the present embodiment, since the load matching pattern LM and the power line VL10 are connected to each other through the additional linking pattern BR10, the load matching pattern LM and the power line VL10 may be formed on various layers. Thus, the display panel may include variously designed lines, and a degree of freedom of circuit design of the display panel may be improved.

In addition, the load matching pattern LM and the power line VL10 may be connected to each other through the additional linking pattern BR10 disposed on the fifth insulating layer 250. Thus, even though static electricity is generated at the load matching pattern LM in the process of forming the fifth insulating layer 250, it is possible to prevent the static electricity from being transferred to the active area AA (see FIG. 3) through the power line VL. As a result, the reliability of the manufacturing processes of the display panel may be improved.

Figure 7:
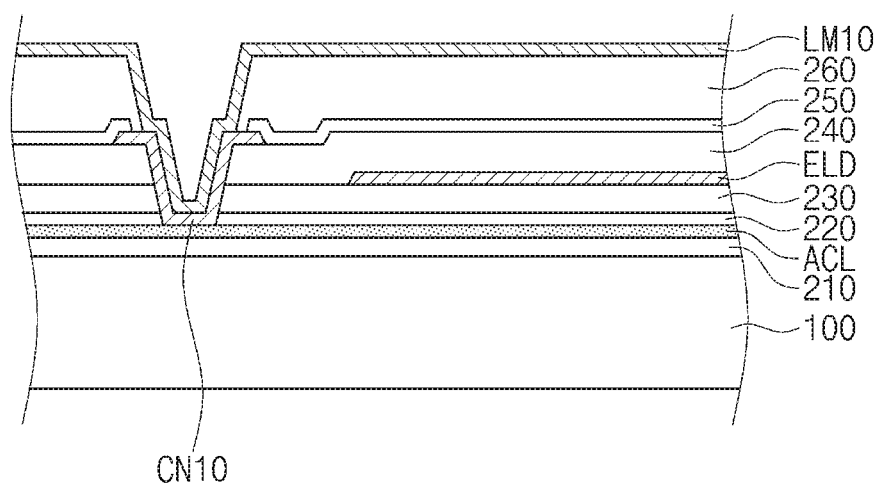
FIG. 7 is a cross-sectional view illustrating a portion of a display panel according to an embodiment of the inventive concept.

FIG. 7 is a cross-sectional view illustrating a portion of a display panel according to an embodiment of the inventive concept. FIG. 7 illustrates an area corresponding to the load matching pattern LM of FIG. 3. Hereinafter, an embodiment of the inventive concept will be described with reference to FIG. 7. In the present embodiment, the same components as described with reference to FIGS. 1 to 6B will be indicated by the same reference numerals or designators, and the descriptions thereto will be omitted for the purpose of ease and convenience in description.

As illustrated in FIG. 7, a load matching pattern LM10 according to an embodiment of the inventive concept may be disposed on the fifth insulating layer 250. In the present embodiment, the load matching pattern LM10 may be disposed on the sixth insulating layer 260. In other words, the load matching pattern LM10 may be disposed on the same layer as the linking pattern BR illustrated in FIG. 4. Thus, the load matching pattern LM10 and the linking pattern BR may be formed at the same time by using one mask.

As illustrated in FIG. 7, the load matching pattern LM10 may be connected to a first layer ACL disposed between the first insulating layer 210 and the second insulating layer 220. The first layer ACL may be provided with the same voltage as a voltage applied to the load matching pattern LM10.

In the present embodiment, the first layer ACL may be disposed on the same layer as the second semiconductor pattern AC2 illustrated in FIG. 4. Thus, the first layer ACL and the second semiconductor pattern AC2 may include the same material and may be formed at the same time by using one mask.

A second layer ELD may be disposed between the first layer ACL and the load matching pattern LM10. The second layer ELD may be disposed between the third insulating layer 230 and the fourth insulating layer 240. In the present embodiment, the second layer ELD may be disposed on the same layer as the first control electrode CE1 illustrated in FIG. 4.

Thus, the second layer ELD and the first control electrode CE1 may include the same material and may be formed at the same time by using one mask. In the present embodiment, the second layer ELD may correspond to the matching line WL (see FIG. 3) connected to the gate line GL (see FIG. 3).

According to the present embodiment, the second layer ELD may form an electric field with each of the load matching pattern LM10 and the first layer ACL. In other words, the second layer ELD and the load matching pattern LM10 may form the electric field with the fourth, fifth and sixth insulating layers 240, 250 and 260 interposed therebetween, and the second layer ELD and the first layer ACL may form the electric field with the second and third insulating layers 220 and 230 interposed therebetween.

According to the present embodiment, since the second layer ELD forms the electric field with each of the load matching pattern LM10 and the first layer ACL, the magnitude of the electric field may be increased in a limited area. Thus, the display panel according to the embodiment may generate a high signal delay even though the peripheral area NAA (see FIG. 3) is narrow. As a result, non-uniform response speeds according to areas may be effectively compensated, and thus the display panel may display an image having uniform brightness.

FIGS. 8A to 8G are cross-sectional views illustrating a method of manufacturing a display panel, according to an embodiment of the inventive concept. FIGS. 8A to 8G illustrate some processes of a method of manufacturing the display panel DP illustrated in FIG. 4. Hereinafter, the method of manufacturing the display panel DP according to an embodiment of the inventive concept will be described with reference to FIGS. 8A and 8G. Meanwhile, the same components as described with reference to FIGS. 1 to 7 will be indicated by the same reference numerals or designators, and the descriptions thereto will be omitted for the purpose of ease and convenience in description.

Figure 8A:
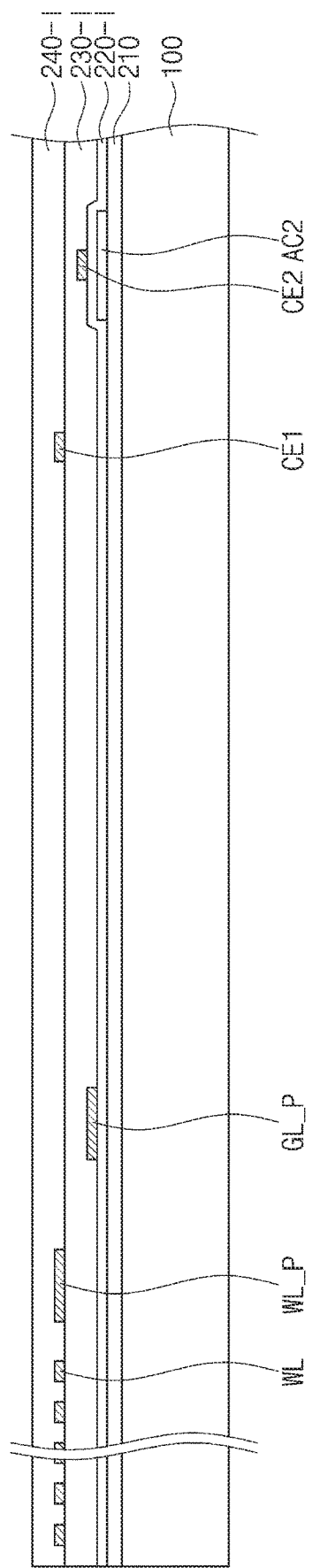
FIGS. 8A, 8B, 8C, 8D, 8E, 8F and 8G are cross-sectional views illustrating a method of manufacturing a display panel, according to an embodiment of the inventive concept.

As illustrated in FIG. 8A, a plurality of insulating layers 210, 220-I, 230-I and 240-I, a plurality of conductive patterns GL_P, WL, WL_P, CE1 and CE2 and the second semiconductor pattern AC2 may be formed on the base substrate 100. The first insulating layer 210 may be formed by depositing or coating an inorganic material and/or an organic material on the base substrate 100.

Thereafter, the second semiconductor pattern AC2 may be formed on the first insulating layer 210. The second semiconductor pattern AC2 may be formed by depositing and/or patterning a semiconductor material. The semiconductor material may include a poly-crystalline semiconductor material, e.g., poly-crystalline silicon.

Subsequently, an initial second insulating layer 220-I may be formed on the first insulating layer 210. The initial second insulating layer 220-I may cover the second semiconductor pattern AC2 and may be formed by depositing or coating an insulating material.

Next, the second control electrode CE2 and the gate line may be formed on the initial second insulating layer 220-I. The pad GL_P of the gate line, which is a portion of the gate line, is illustrated in FIG. 8A for the purpose of ease and convenience in illustration. The second control electrode CE2 and the pad GL_P of the gate line may be formed of the same conductive material and may be patterned using one mask at the same time.

Subsequently, an initial third insulating layer 230-I may be formed on the initial second insulating layer 220-I. The initial third insulating layer 230-I may cover the second control electrode CE2 and the pad GL_P of the gate line and may be formed by depositing or coating an insulating material.

Subsequently, the first control electrode CE1, the matching lines WL, and the pad WL_P of the matching line corresponding to a portion of the matching line WL may be formed on the initial third insulating layer 230-I. The first control electrode CE1, the matching lines WL, and the pad WL_P of the matching line may be formed of the same conductive material and may be patterned using one mask at the same time.

Next, an initial fourth insulating layer 240-I may be formed on the initial third insulating layer 230-I. The initial fourth insulating layer 240-I may cover the first control electrode CE1, the matching lines WL, and the pad WL_P of the matching line and may be formed by depositing or coating an insulating material.

Figure 8B:
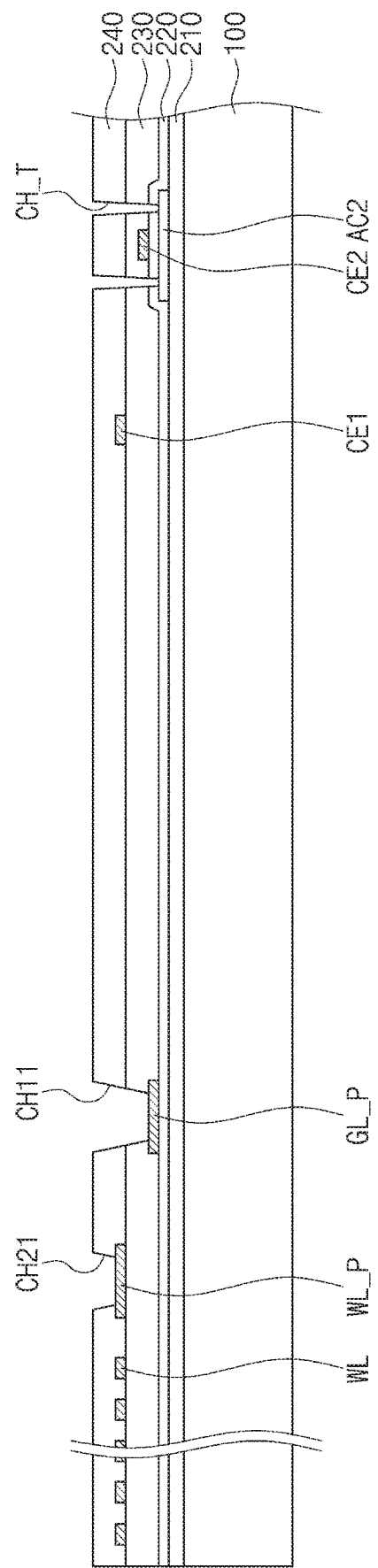

Thereafter, as illustrated in FIG. 8B, contact-holes CH_T, CH11 and CH21 may be formed in the initial insulating layers 220-I, 230-I and 240-I to form the second to fourth insulating layers 220, 230 and 240. First contact-holes CH_T exposing portions of the second semiconductor pattern AC2 may be formed in the initial fourth insulating layer 240-I, the initial third insulating layer 230-I, and the initial second insulating layer 220-I.

In addition, a second contact-hole CH11 exposing the pad GL_P of the gate line may be formed in the initial fourth insulating layer 240-I and the initial third insulating layer 230-I, and a third contact-hole CH21 exposing the pad WL_P of the matching line may be formed in the initial fourth insulating layer 240-I.

Figure 8C:
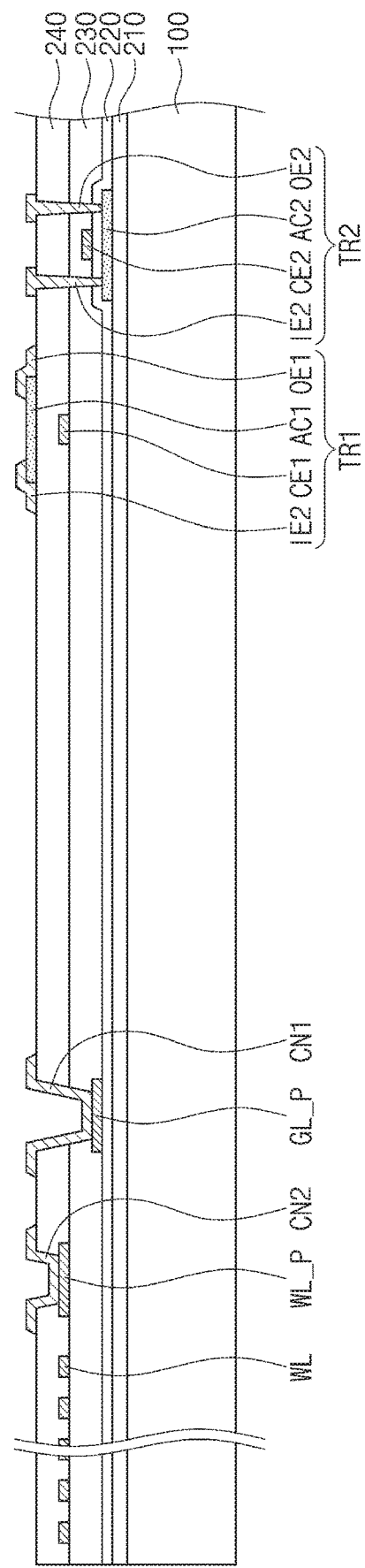

Next, as illustrated in FIG. 8C, the first input electrode IE1, the first output electrode OE1, the first semiconductor pattern AC1, the second input electrode IE2, the second output electrode OE2, the first connection pattern CN1, and the second connection pattern CN2 may be formed on the fourth insulating layer 240. The first semiconductor pattern AC1 is formed of a semiconductor material. The first semiconductor pattern AC1 may include an oxide semiconductor. Thus, the first semiconductor pattern AC1 may be formed before the formation of the first input electrode IE1, the first output electrode OE1, the second input electrode IE2, the second output electrode OE2, the first connection pattern CN1, and the second connection pattern CN2, which correspond to conductive patterns.

The first input electrode IE1, the first output electrode OE1, the second input electrode IE2, the second output electrode OE2, the first connection pattern CN1, and the second connection pattern CN2 may be formed of the same conductive material and may be patterned using one mask at the same time.

Meanwhile, the second input electrode IE2, the second output electrode OE2, the first connection pattern CN1, and the second connection pattern CN2 may also be formed in the contact-holes CH_T, CH11 and CH21. The second input electrode IE2 and the second output electrode OE2 may be formed in the first contact-holes CH_T so as to be connected to the portions of the second semiconductor pattern AC2, respectively. The first connection pattern CN1 may be formed in the second contact-hole CH11 so as to be connected to the pad GL_P of the gate line, and the second connection pattern CN2 may be formed in the third contact-hole CH21 so as to be connected to the pad WL_P of the matching line.

On the other hand, the first input electrode IE1 and the first output electrode OE1 may be formed on the same layer as the first semiconductor pattern AC1 and may cover portions of the first semiconductor pattern AC1, respectively. Thus, each of the first input electrode TE1 and the first output electrode OE1 may be in direct contact with a top surface and a side surface of the first semiconductor pattern AC1.

Figure 8D:
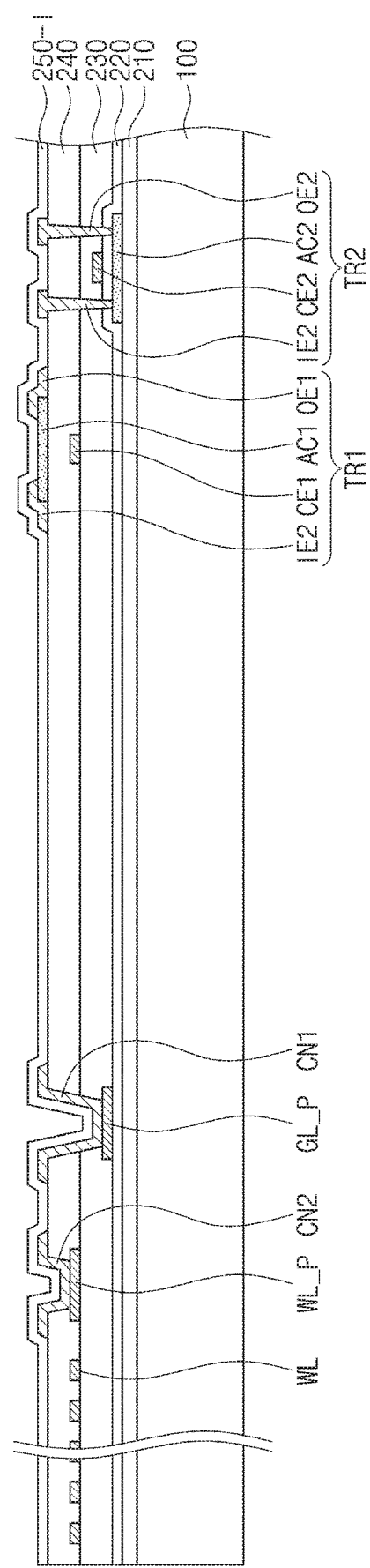

Next, as illustrated in FIG. 8D, an initial fifth insulating layer 250-I may be formed on the fourth insulating layer 240. The initial fifth insulating layer 250-I may be formed to cover the first input electrode IE1, the first output electrode OE1, the first semiconductor pattern AC1, the second input electrode IE2, the second output electrode OE2, the first connection pattern CN1, and the second connection pattern CN2.

At this time, the initial fifth insulating layer 250-I may be formed by depositing an inorganic material. The inorganic material may include at least one of silicon oxide, silicon nitride, or silicon oxynitride.

The deposition process for the initial fifth insulating layer 250-I may include a chemical vapor deposition (CVD) process, a physical vapor deposition (PVD) process, and/or an atomic layer deposition (ALD) process. Static electricity may be generated in the process of depositing the inorganic material on the fourth insulating layer 240.

At this time, the patterns having conductivity may be a transfer path of the static electricity. In other words, in FIG. 8D, the static electricity may be easily transferred to the first input electrode IE1, the first output electrode OE1, the second input electrode IE2, the second output electrode OE2, the first connection pattern CN1, and the second connection pattern CN2, which are in contact with the initial fifth insulating layer 250-I.

According to the inventive concept, the first input electrode IE1, the first output electrode OE1, the second input electrode IE2, the second output electrode OE2, the first connection pattern CN1 and the second connection pattern CN2 are not connected to each other but are spaced apart from each other when viewed in a plan view.

Thus, the first input electrode IE1, the first output electrode OE1, the second input electrode IE2, the second output electrode OE2, the first connection pattern CN1 and the second connection pattern CN2 are disconnected from each other and thus do not electrically affect each other even though the static electricity is provided to the electrodes IE1, OE1, IE2 and OE2 and the connection patterns CN1 and CN2.

As a result, the static electricity generated in the deposition process for the initial fifth insulating layer 250-I may affect only each of the electrodes IE1, OE1, IE2 and OE2 and the connection patterns CN1 and CN2 but may not be transferred therebetween, and thus it is possible to reduce or minimize the influence of the static electricity on other elements formed on the base substrate 100. Accordingly, damage of the elements by the static electricity may be prevented, and reliability of manufacturing processes of the display panel may be improved.

Figure 8E:
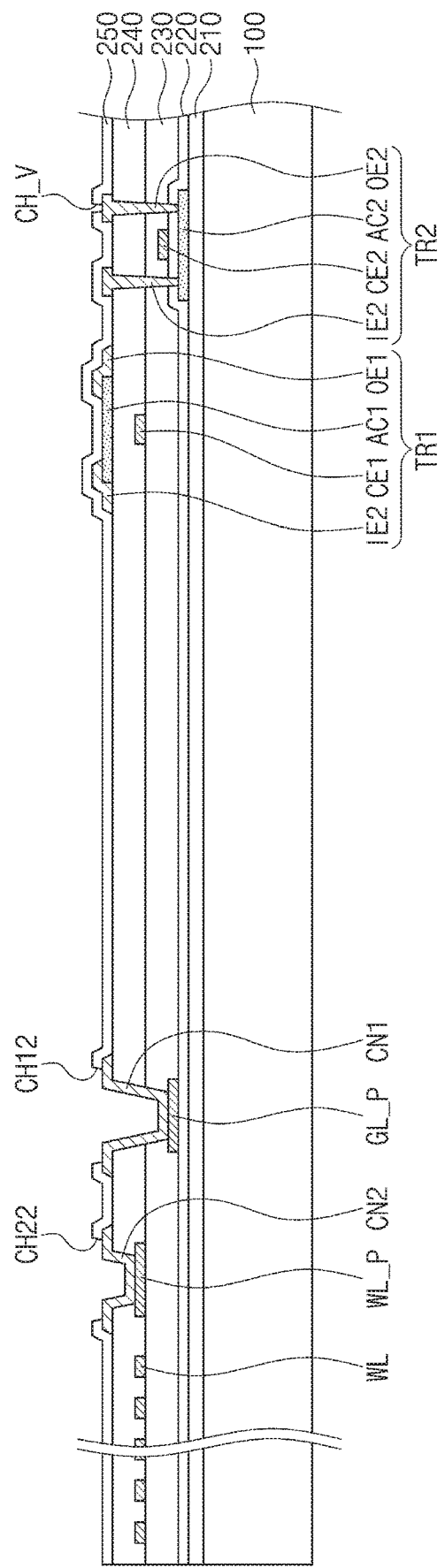

Thereafter, as illustrated in FIG. 8E, contact-holes CH12, CH22 and CH_V may be formed in the initial fifth insulating layer 250-I to form the fifth insulating layer 250. A fourth contact-hole CH_V may be formed to expose the second output electrode OE2. In addition, a fifth contact-hole CH12 may be formed to expose the first connection pattern CN1, and a sixth contact-hole CH22 may be formed to expose the second connection pattern CN2.

Figure 8F:
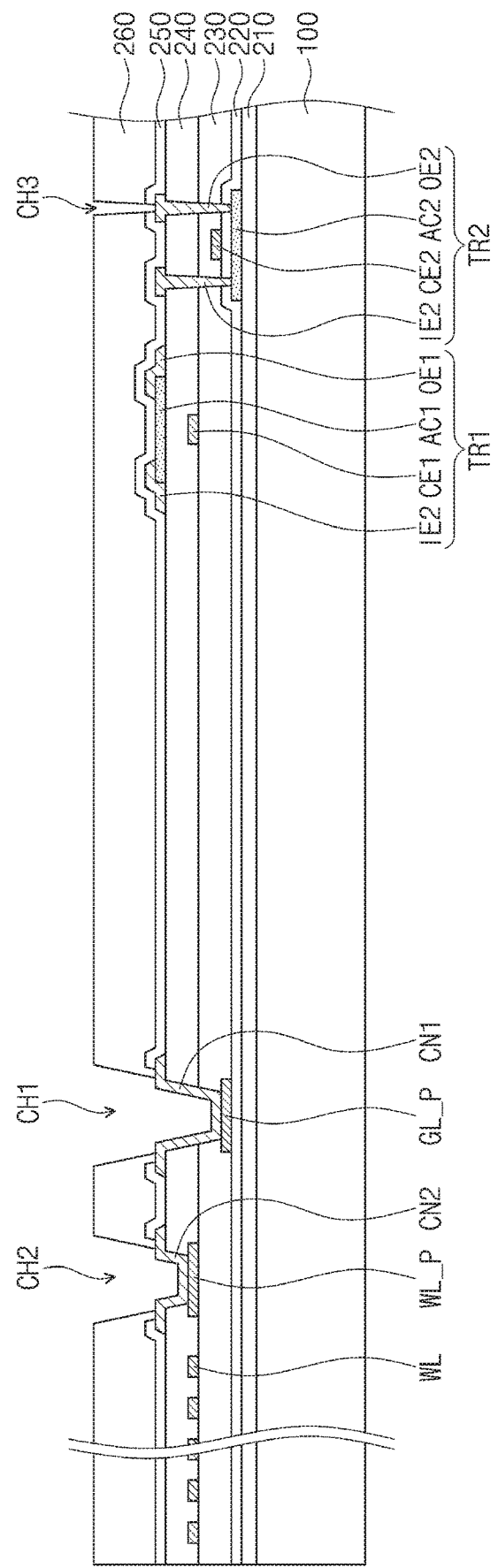

Next, as illustrated in FIG. 8F, the sixth insulating layer 260 may be formed on the fifth insulating layer 250. An initial layer of an insulating material may be formed to cover the fifth insulating layer 250, and then, a plurality of contact holes may be formed in the initial layer to form the sixth insulating layer 260.

The initial layer may be formed of an organic material or may be formed of an organic material and an inorganic material. The initial layer may be formed by a coating process. The initial layer may be formed to have an appropriate thickness such that it has a flat top surface.

A first contact hole CH1 may be formed in an area corresponding to the fifth contact-hole CH21 and may expose the first connection pattern CN1. A second contact hole CH2 may be formed in an area corresponding to the sixth contact-hole CH22 and may expose the second connection pattern CN2. In addition, a third contact hole CH3 may be formed in an area corresponding to the fourth contact-hole CH_V and may expose the second output electrode OE2. The contact holes CH22, CH12, CH_V, CH1, CH2 and CH3 described in FIGS. 8E and 8F may be formed using one mask after sequentially forming the initial fifth insulating layer 250-I and the initial sixth insulating layer 260-I.

Figure 8G:
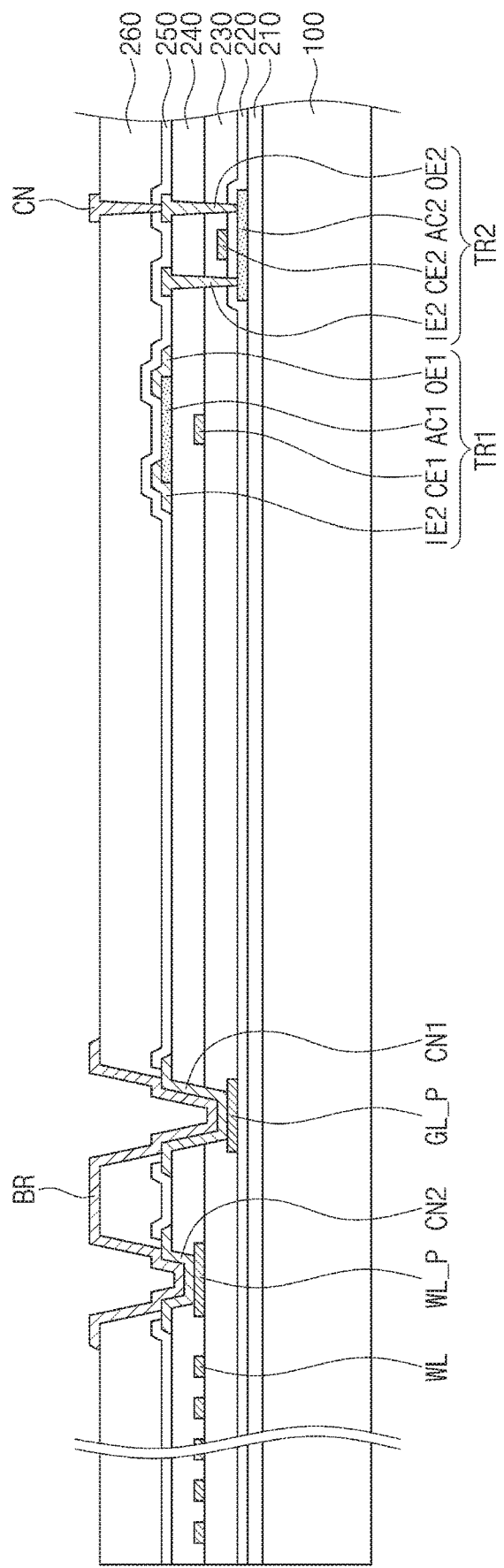

Thereafter, as illustrated in FIG. 8G, the linking pattern BR and the connection pattern CN may be formed on the sixth insulating layer 260. The linking pattern BR and the connection pattern CN may be disposed on the same layer. Thus, the linking pattern BR and the connection pattern CN may be formed of the same conductive material and may be patterned using one mask at the same time.

The linking pattern BR may be formed to overlap with the first contact hole CH1 and the second contact hole CH2. According to the embodiment of the inventive concept, since the linking pattern BR is formed after the formation of the sixth insulating layer 260, the electrical connection of the pad WL_P of the matching line and the pad GL_P of the gate line may be formed after the formation of the fifth insulating layer 250.

Thus, even though the static electricity is generated at the peripheral area NAA in the process of forming the fifth insulating layer 250, it is possible to prevent the static electricity from being transferred to the pad GL_P of the gate line and the active area AA (see FIG. 3) through the linking pattern BR. As a result, the reliability of the manufacturing processes of the display panel may be improved.

According to the inventive concept, an image having uniform brightness may be displayed in the active area including a partially protruding area. Thus, display quality of images displayed in variously shaped active areas may be improved.

In addition, according to the inventive concept, it is possible to prevent the elements disposed in the active area from being damaged by the static electricity which may be generated in the manufacturing process. As a result, the reliability of the manufacturing processes of the display panel may be improved.

While the inventive concept has been described with reference to example embodiments, it will be apparent to those skilled in the art that various changes and modifications may be made without departing from the spirits and scopes of the inventive concept. Therefore, it should be understood that the above embodiments are not limiting, but illustrative. Thus, the scopes of the inventive concept are to be determined by the broadest permissible interpretation of the following claims and their equivalents, and shall not be restricted or limited by the foregoing description.

What is claimed is:

1. A display panel comprising:
   a base substrate in which an active area and a peripheral area adjacent to the active area are defined;

a pixel disposed in the active area;
a first line disposed in the active area and connected to the pixel;
a second line disposed in the peripheral area and spaced apart from the first line in a plan view;
a linking pattern disposed on a layer different from a layer on which each of the first and second lines is disposed, the linking pattern electrically connecting the first line to the second line;
an inorganic layer disposed between the first line and the linking pattern and between the second line and the linking pattern; and
a load matching pattern disposed in the peripheral area,
wherein the second line overlaps with the load matching pattern in a plan view,
wherein the first line provides a gate voltage to the pixel, and
wherein the linking pattern is connected to the first line and the second line with penetrating the inorganic layer.

2. The display panel of claim 1, wherein the pixel comprises: a thin film transistor; and an organic light emitting element connected to the thin film transistor, and
wherein the inorganic layer is disposed between the thin film transistor and the organic light emitting element.

3. The display panel of claim 2, further comprising:
a first conductive pattern disposed between the first line and the linking pattern and being in contact with the first line; and
a second conductive pattern disposed between the second line and the linking pattern and being in contact with the second line,
wherein the linking pattern is connected to the first conductive pattern and the second conductive pattern through contact holes which are defined in the inorganic layer to expose the first conductive pattern and the second conductive pattern, respectively.

4. The display panel of claim 3, wherein the thin film transistor comprises: a semiconductor pattern; a control electrode overlapping the semiconductor pattern in a plan view; and an input electrode and an output electrode respectively connected to portions of the semiconductor pattern and spaced apart from each other with the control electrode interposed therebetween, and
wherein the first conductive pattern and the second conductive pattern are disposed on the same layer as the input electrode and the output electrode.

5. The display panel of claim 1, wherein the load matching pattern receives a power voltage.

6. The display panel of claim 5, further comprising:
a third line which is disposed in the active area to intersect the first line and is connected to the pixel,
wherein the third line is electrically connected to the load matching pattern.

7. The display panel of claim 6, wherein the inorganic layer covers the third line, and
wherein the third line and the load matching pattern constitute a single body shape.

8. The display panel of claim 6, further comprising:
a load matching linking pattern disposed on the inorganic layer,
wherein the third line is spaced apart from the load matching pattern in a plan view, and
wherein the load matching linking pattern electrically connects the load matching pattern and the third line with penetrating the inorganic layer.

9. The display panel of claim 8, wherein the second line forms an electric field with the load matching pattern.

10. The display panel of claim 1, further comprising:
an organic layer disposed on the inorganic layer,
wherein the linking pattern electrically connects the first line and the second line with penetrating each of the inorganic layer and the organic layer.

11. The display panel of claim 1, wherein the active area includes a plurality of protruding areas facing each other with a notch interposed therebetween,
wherein each of the pixel, the first line and the second line is provided in plurality, and
wherein the second lines are electrically connected to the first lines which are connected to pixels disposed in the protruding areas.

12. The display panel of claim 1, wherein the linking pattern extends in one direction, and
wherein the first line and the second line are spaced apart from each other in the one direction.

13. A display panel comprising:
a base substrate in which an active area and a peripheral area adjacent to the active area are defined;
a pixel disposed in the active area;
a first line disposed in the active area and connected to the pixel;
a second line disposed in the peripheral area and spaced apart from the first line in a plan view;
a linking pattern disposed on a layer different from a layer on which each of the first and second lines is disposed, the linking pattern electrically connecting the first line to the second line;
an inorganic layer disposed between the first line and the linking pattern and between the second line and the linking pattern;
a first conductive pattern disposed between the first line and the linking pattern and being in contact with the first line; and
a second conductive pattern disposed between the second line and the linking pattern and being in contact with the second line,
wherein the linking pattern is connected to the first line and the second line with penetrating the inorganic layer, and
wherein the linking pattern is connected to the first conductive pattern and the second conductive pattern through contact holes which are defined in the inorganic layer to expose the first conductive pattern and the second conductive pattern, respectively.

14. A display panel comprising:
a base substrate in which an active area and a peripheral area adjacent to the active area are defined;
a pixel disposed in the active area;
a first line disposed in the active area and connected to the pixel;
a second line disposed in the peripheral area and spaced apart from the first line in a plan view;
a third line which is disposed in the active area to intersect the first line and is connected to the pixel;
a linking pattern disposed on a layer different from a layer on which each of the first and second lines is disposed, the linking pattern electrically connecting the first line to the second line;
an inorganic layer disposed between the first line and the linking pattern and between the second line and the linking pattern; and
a load matching pattern disposed in the peripheral area,
wherein the second line overlaps with the load matching pattern in a plan view, wherein the load matching pattern receives a power voltage, wherein the third line is electrically connected to the load matching pattern, wherein the linking pattern is connected to the first line and the second line with penetrating the inorganic layer.

15. The display panel of claim 14, wherein the inorganic layer covers the third line, and wherein the third line and the load matching pattern constitute a single body shape.

16. The display panel of claim 14, further comprising:

a load matching linking pattern disposed on the inorganic layer, wherein the third line is spaced apart from the load matching pattern in a plan view, and wherein the load matching linking pattern penetrates the inorganic layer to electrically connect the load matching pattern and the third line to each other.

17. A display panel comprising:

a base substrate in which an active area and a peripheral area adjacent to the active area are defined;

a pixel disposed in the active area;

a first line disposed in the active area and connected to the pixel;

a second line disposed in the peripheral area and spaced apart from the first line in a plan view;

a linking pattern disposed on a layer different from a layer on which each of the first and second lines is disposed, the linking pattern electrically connecting the first line to the second line; and an inorganic layer disposed between the first line and the linking pattern and between the second line and the linking pattern, wherein the linking pattern is connected to the first line and the second line with penetrating the inorganic layer, wherein the active area includes a plurality of protruding areas facing each other with a notch interposed therebetween, wherein each of the pixel, the first line and the second line is provided in plurality, and wherein the second lines are electrically connected to the first lines which are connected to pixels disposed in the protruding areas.

* * * * *